United States Patent
Parkin

(10) Patent No.: US 6,359,289 B1
(45) Date of Patent: Mar. 19, 2002

(54) MAGNETIC TUNNEL JUNCTION DEVICE WITH IMPROVED INSULATING TUNNEL BARRIER

(75) Inventor: Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/552,062

(22) Filed: Apr. 19, 2000

(51) Int. Cl.⁷ ............................................... H01L 29/12

(52) U.S. Cl. ...................... 257/43; 257/295; 365/158; 428/694 NF; 428/694 XS

(58) Field of Search ....................... 257/43, 295, 421, 257/422; 365/173, 158; 428/692, 694

(56) References Cited

U.S. PATENT DOCUMENTS

| | | | |
|---|---|---|---|
| 5,640,343 A | 6/1997 | Gallagher et al. | 365/171 |
| 5,729,410 A | 3/1998 | Fontana, Jr. et al. | 360/113 |
| 5,801,984 A * | 9/1998 | Parkin | 365/158 |
| 6,146,775 A * | 11/2000 | Fujita et al. | 428/692 |
| 6,219,274 B1 * | 4/2001 | Shimizawa et al. | 365/158 |

FOREIGN PATENT DOCUMENTS

EP   0 911 811 A2 *   4/1999

OTHER PUBLICATIONS

S. S. P. Parkin et al., "Exchange–Biased Magnetic Tunnel Junctions and Application to Nonvolatile Magnetic Random Access Memory (Invited)" Journal of Applied Physics, vol. 85, No. 8, Apr. 15, 1999, pp. 5828–5833.

* cited by examiner

*Primary Examiner*—Nathan Flynn
*Assistant Examiner*—Ahmed N. Sefer
(74) *Attorney, Agent, or Firm*—Thomas R. Berthold

(57) ABSTRACT

A magnetic tunnel junction device has a tunnel barrier made of a material consisting essentially of an oxide or nitride of one or more of gallium and indium. An oxide or nitride of aluminum may be included as part of this tunnel barrier material. In one embodiment the tunnel barrier is an oxide of a gallium-aluminum alloy ($Ga_{75}Al_{25}$). The Ga oxide tunnel barrier may be formed by sputter deposition of Ga, followed by a plasma oxidation, or by depositing Ga from an effusion source in the presence of oxygen gas or in the presence of more reactive oxygen provided by an atomic oxygen source or other source. The tunnel barrier layer may also be formed as a bi-layer structure with an aluminum oxide layer formed directly on one of the ferromagnetic layers of the device, followed by a gallium oxide layer formed directly on the aluminum oxide layer. By appropriate selection of the amounts of gallium and or aluminum, or the thicknesses of the aluminum oxide and gallium oxide in the bi-layer structure, the tunnel barrier energy height can be tuned to a selected value. The magnetic tunnel junction devices made with the improved tunnel barrier material show a substantially reduced tunnel barrier energy height (and thus lower resistance-area values) compared to conventional devices using aluminum oxide tunnel barriers, without a reduction in magnetoresistance.

11 Claims, 4 Drawing Sheets

MAGNETIC TUNNEL JUNCTION DEVICE WITH IMPROVED INSULATING TUNNEL BARRIER

STATEMENT OF GOVERNMENT RIGHTS

The United States Government has a paid-up license in this invention and the right in limited circumstances to require the patent owner to license others on reasonable terms as provided for by the terms of Contract No. MDA972-96-C-0030 awarded by the Defense Advanced Research Projects Agency.

TECHNICAL FIELD

This invention relates to magnetic tunnel junction (MTJ) devices for memory and external magnetic field-sensing applications. More particularly the invention relates to a MTJ device that uses an improved insulating tunnel barrier material that improves the properties of the MTJ.

BACKGROUND OF THE INVENTION

A magnetic tunnel junction (MTJ) is comprised of two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as a memory cell in a nonvolatile magnetic random access memory (MRAM) array, as described in IBM's U.S. Pat. No. 5,640,343, and as a magnetic field sensor, such as a magnetoresistive read head in a magnetic recording disk drive, as described in IBM's U.S. Pat. No. 5,729,410.

FIG. 1 illustrates a cross-section of a conventional MTJ device. The MTJ 10 includes a bottom "fixed" ferromagnetic (FM) layer 18, an insulating tunnel barrier layer 20, and a top "free" FM layer 32. The MTJ 10 has bottom and top electrical leads, 12, 14, respectively, with the bottom lead 12 being formed on a suitable substrate. The FM layer 18 is called the "fixed" layer because it is formed of a high-coercivity material whose magnetic moment (magnetization direction) is prevented from rotation in the presence of applied magnetic fields in the desired range of interest for the MTJ device, i.e., the magnetic field caused by the write current applied to the memory cell from the read/write circuitry of the MRAM or the magnetic field from the recorded magnetic layer in a magnetic recording disk. The magnetic moment of FM layer 18 can also be fixed by being exchange coupled to an antiferromagnetic layer. The magnetic moment of the free FM layer 32 is not fixed, and is thus free to rotate in the presence of an applied magnetic field in the range of interest. In the absence of an applied magnetic field the moments of the FM layers 18 and 32 are aligned generally parallel (or antiparallel) in a MTJ memory cell and generally perpendicular in a MTJ magnetoresistive read head. The relative orientation of the magnetic moments of the FM layers 18, 32 affects the tunneling current and thus the electrical resistance of the MTJ device.

What is important for MTJ device applications is the signal-to-noise ratio (SNR). The magnitude of the signal is dependent upon the magnetoresistance or MR ($\Delta R/R$) exhibited by the device. The signal is given by $i_B \Delta R$, which is the bias current ($i_B$) passing through the MTJ device (assuming a constant current is used to detect the signal) times the resistance change ($\Delta R$) of the device. However, the noise exhibited by the MTJ device is determined, in large part, by the resistance R of the device. Thus to obtain the maximum SNR for constant power used to sense the device the resistance (R) of the device must be small and the change in resistance ($\Delta R$) of the device large.

The resistance of a MTJ device is largely determined by the resistance of the insulating tunnel barrier layer for a device of given dimensions since the resistance of the electrical leads and the ferromagnetic layers contribute little to the resistance. Moreover, because the sense current passes perpendicularly through the ferromagnetic layers and the tunnel barrier layer, the resistance R of a MTJ device increases inversely with the area A of the device. The requirement for low resistance MTJ devices, coupled with the inverse relationship of resistance with area, is especially troublesome because an additional requirement for MTJ device applications is small area. For an MRAM the density of MTJ memory cells in the array depends on small area MTJs, and for a read head high storage density requires small data trackwidth on the disk, which requires a small area MTJ read head. Since the resistance R of a MTJ device scales inversely with the area A, it is convenient to characterize the resistance of the MTJ device by the product of the resistance R times the area A (RA). Thus RA is independent of the area A of the MTJ device.

In prior art MTJs, the material used for the tunnel barrier layer is aluminum oxide ($Al_2O_3$) because such barrier layers can be made very thin and essentially free of pin holes. For $Al_2O_3$ barrier layers it has been found that RA increases exponentially with the thickness of the layer. The thickness of $Al_2O_3$ barrier layers can be varied over a sufficient range to vary RA by more than eight orders of magnitude, i.e., from more than $2 \times 10^9$ $\Omega(\mu m)^2$ to as little as 20 $\Omega(\mu m)^2$. However, for these lower resistance values, the MR is typically reduced, most likely because of the formation of quantum point defects or microscopic pin holes in the ultra thin tunnel barrier layers needed to obtain these very low RA values. For MRAM applications RA values in the range 500–1000 $\Omega(\mu m)^2$ are acceptable, although it would be useful to be able to prepare MTJ memory cells with even lower RA values so that, for example, current could be passed perpendicularly through the MTJ cell to aid in the writing of the cell. Moreover, for scaling to ever higher memory capacities, MRAM cells will need to be shrunk in size, requiring lower RA values so that the resistance of the cell is not too high. More importantly, for MTJ read heads to be competitive in SNR with conventional giant magnetoresistance (GMR) spin-valve read heads, the MTJ heads need to have resistance values comparable to those of GMR heads. Since read heads of sub-micron size are required for high density recording applications, MTJ heads with RA values lower than those which can be obtained with $Al_2O_3$ tunnel barriers are needed. For otherwise the same size MTJ device, read heads typically require lower RA values that MRAM cells. This is because in the operation of the MRAM cell only two states of the cell need to be distinguished, where the magnetic moments of the ferromagnetic layers in the device are either parallel or antiparallel to one another. By contrast, for read heads, the response of the device must be monitored continuously over a wide range of states of the device.

Thus, it is desirable to develop MTJ devices with lower RA values than can be achieved with MTJ devices that use conventional $Al_2O_3$ tunnel barriers, and where the lower RA values can be achieved without sacrificing high MR.

SUMMARY OF THE INVENTION

The invention is a magnetic tunnel junction device with a tunnel barrier made of a material consisting essentially of an oxide or nitride of one or more of gallium and indium. An oxide or nitride of aluminum may be included as part of this tunnel barrier material. In one embodiment the tunnel barrier is an oxide of a gallium-aluminum alloy ($Ga_{75}Al_{25}$). The Ga oxide tunnel barrier may be formed by sputter deposition of Ga, followed by a plasma oxidation, or by depositing Ga from an effusion source in the presence of oxygen gas or in the presence of more reactive oxygen provided by an atomic oxygen source or other source. The tunnel barrier layer may also be formed as a bi-layer structure with an aluminum oxide layer formed directly on one of the ferromagnetic layers of the device, followed by a gallium oxide layer formed directly on the aluminum oxide layer. By appropriate selection of the amounts of gallium and or aluminum, or the thicknesses of the aluminum oxide and gallium oxide in the bi-layer structure, the tunnel barrier energy height can be tuned to a selected value. The magnetic tunnel junction devices made with the improved tunnel barrier material show a substantially reduced tunnel barrier energy height (and thus lower RA values) compared to conventional devices using aluminum oxide tunnel barriers, without a reduction in magnetoresistance.

For a fuller understanding of the nature and advantages of the invention, reference should be made to the following detailed description taken together with the accompanying figures.

DESCRIPTION OF THE PREFERRED EMBODIMENTS

Since the RA of a MTJ is determined largely by the thickness of the tunnel barrier layer and the tunneling barrier "height" (the electrical potential across the thickness of the tunnel barrier that is presented to the electrons) it is desirable to develop alternative barrier materials which have lower tunneling barrier heights than $Al_2O_3$. In the invention the MTJ devices have tunnel barriers made of materials which have significantly lower tunneling barrier heights than $Al_2O_3$. The MTJ devices thus have lower RA values, yet exhibit high MR values at room temperature.

Figure 1:
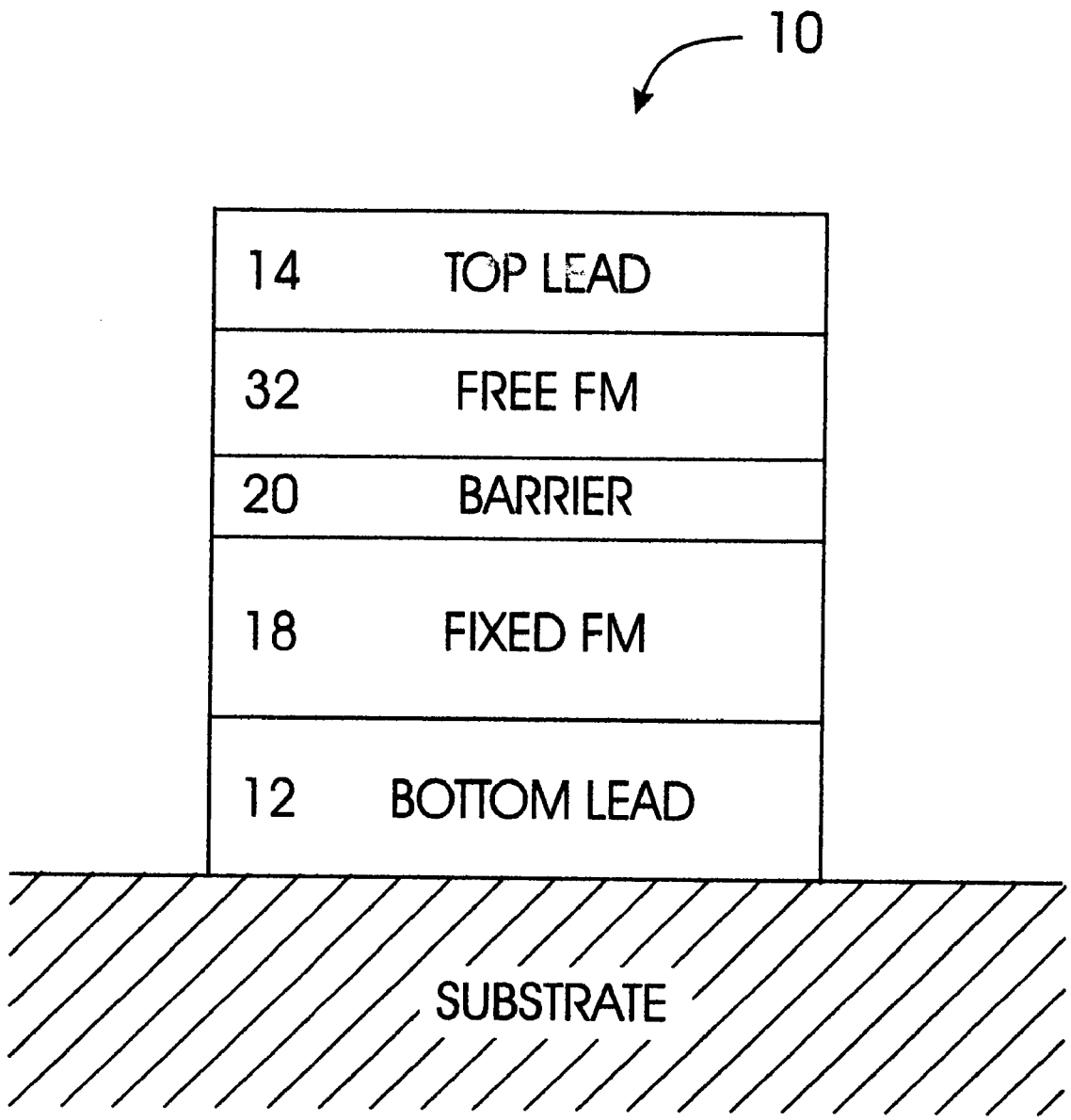
FIG. 1 shows a cross-section view of a conventional MTJ device.
Figure 2A:
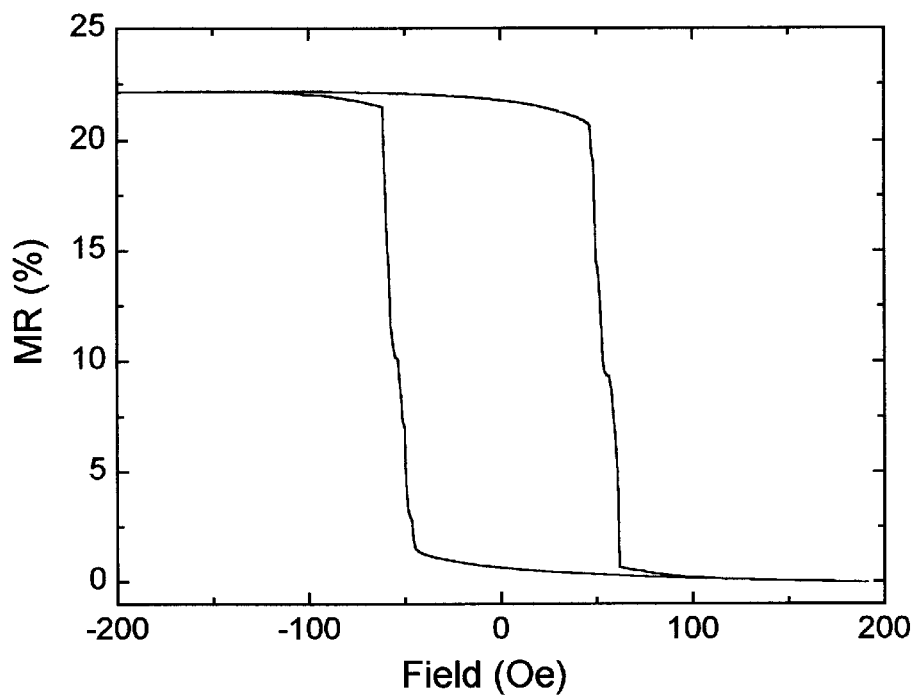
FIGS. 2A–2B show the resistance versus applied magnetic field data for a MTJ with an oxide of a Ga—Al alloy as the tunnel barrier layer.
Figure 2B:
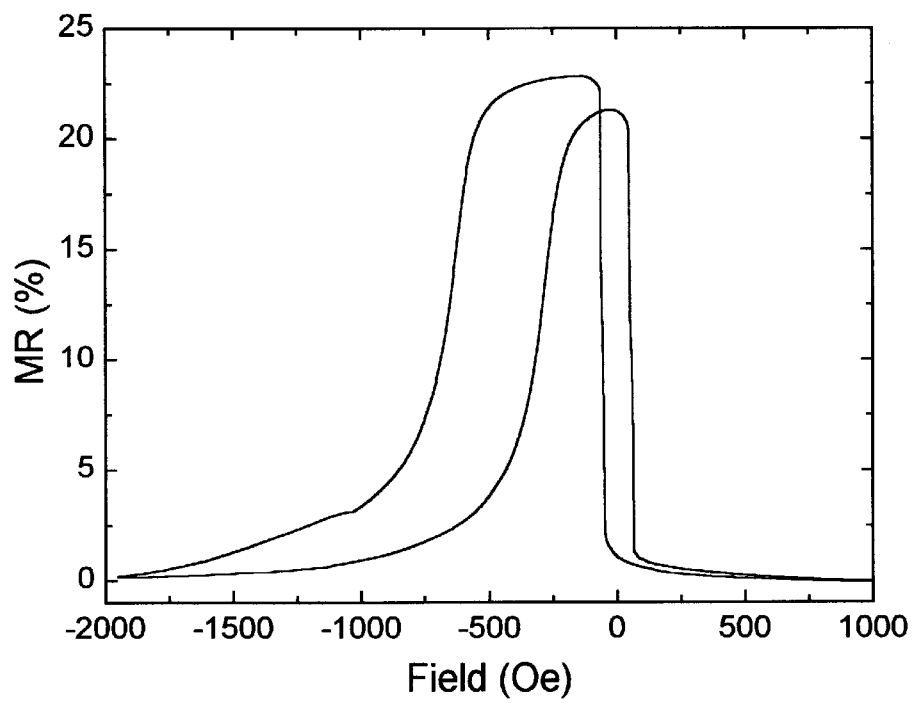

The MTJ devices in the invention have the general structure of a MTJ as shown in FIG. 1, but use tunnel barriers made of gallium (Ga) oxides or oxides of Ga and Al. FIGS. 2A–2B show the resistance versus applied magnetic field data for a MTJ device with a tunnel junction area of 80 $\mu m \times 80$ $\mu m$ formed on a substrate of a $SiO_2$ film on silicon and having the following structure:

Si/5000 Å $SiO_2$/225 Å Cu/200 Å $Os_{10}Ir_{10}Mn_{80}$/24 Å $Co_{84}Fe_{16}$/$Ga_{75}Al_{25}$ (oxidized for 360 seconds)/180 Å $Co_{84}Fe_{16}$/30 Å cu.

This MTJ has a fixed ferromagnetic layer of $Co_{84}Fe_{16}$ which is pinned by being exchange coupled to the $Os_{10}Ir_{10}Mn_{80}$ antiferromagnetic layer. This MTJ exhibits an MR value of more than 22% at room temperature after the structure was annealed at 160° C. for 15 minutes to set the exchange bias field provided by the antiferromagnetic layer. The tunnel barrier layer was formed by first depositing a thin film of Ga—Al from a $Ga_{75}Al_{25}$ sputtering target and then plasma oxidizing the film for 360 seconds in 100 mTorr oxygen. The resulting oxide film was approximately 20 Å thick. The sputtering target was made by creating a very shallow bucket from copper into which a Ga—Al melt was poured. The RA value for this MTJ device is about 10,000 times lower than the RA value for a comparable device with an $Al_2O_3$ barrier layer of the same thickness.

Figure 3:
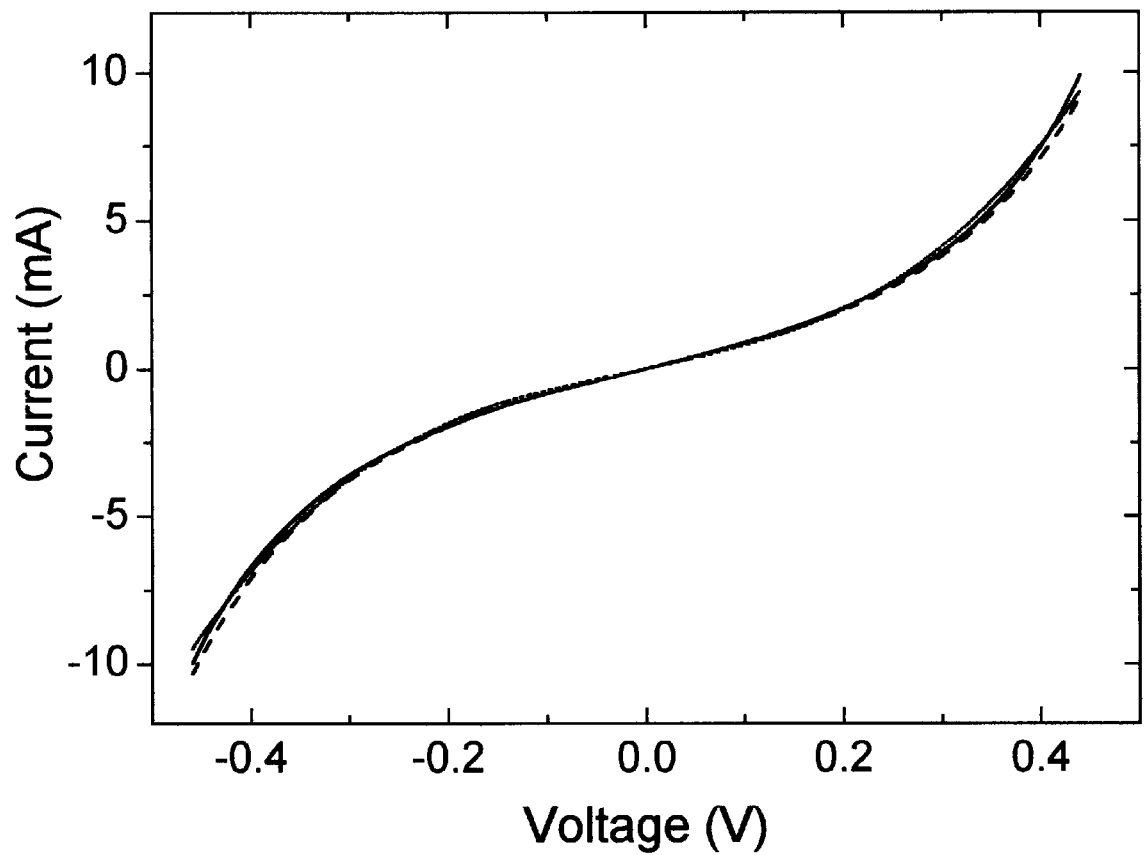
FIG. 3 shows the current vs. bias voltage (I–V) curve for the MTJ whose data is shown in FIGS. 2A–2B, with the I–V data curve fit using the Simmon's model and the Brinkman's model for tunneling.

FIG. 3 shows the current vs. bias voltage curve for the same MTJ whose data is shown in FIGS. 2A–2B. The I–V data (solid line) has been curve fit with the Simmons model and the Brinkman's model for tunneling (which are difficult to detect on FIG. 3 because their curves overlap the I–V data but are actually the dashed line and dotted line, respectively). In the Simmon's model [J. G. Simmons, *J. Appl. Phys.* 34, 1793 (1963)] the tunneling barrier is assumed to be of a constant energy height across the width of the barrier, whereas in the Brinkman's model [W. F. Brinkman et al., *J. Appl. Phys.* 41, 1915 (1970)] the barrier energy height is assumed to vary linearly across the barrier width. The I–V data fitted to these models gives a tunneling barrier height of approximately 0.65 volts and a tunnel barrier thickness of approximately 20 Å for both models. This barrier height is significantly lower than the barrier height of a tunnel barrier formed from $Al_2O_3$ of a comparable thickness. For such MTJs with $Al_2O_3$ barriers formed by oxidation of thin aluminum layers, the barrier height would be approximately in the range of 2.3–3 volts, depending on the extent of oxidation of the barrier. This means that the MTJ formed with the Ga—Al oxide barrier is more than 10,000 times lower in resistance than an MTJ with an $Al_2O_3$ tunnel barrier of comparable thickness.

Figure 4A:
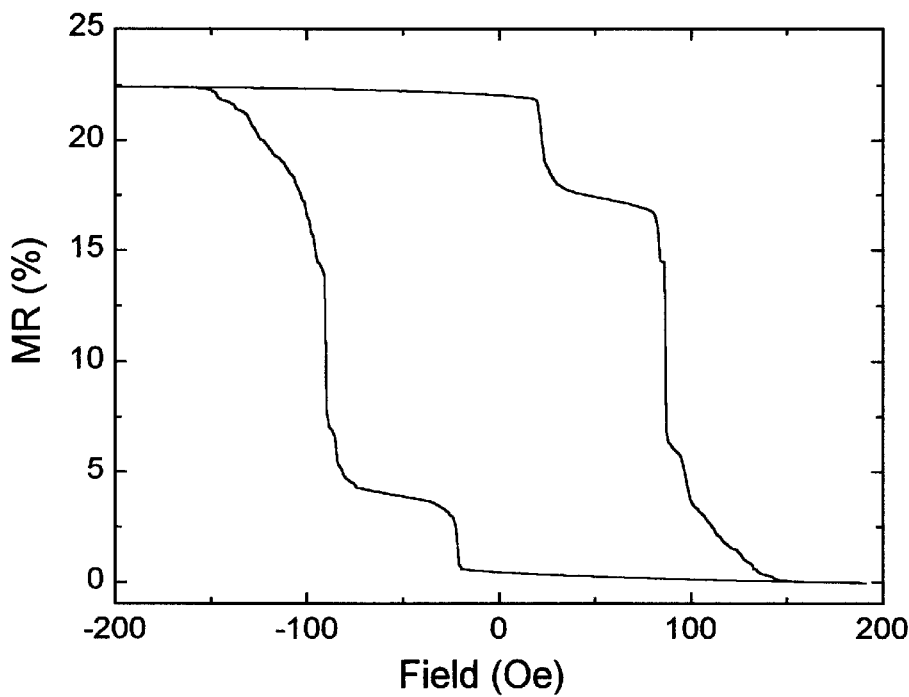
FIGS. 4A–4B show the resistance versus applied magnetic field data for a MTJ with a Ga oxide tunnel barrier layer.
Figure 4B:
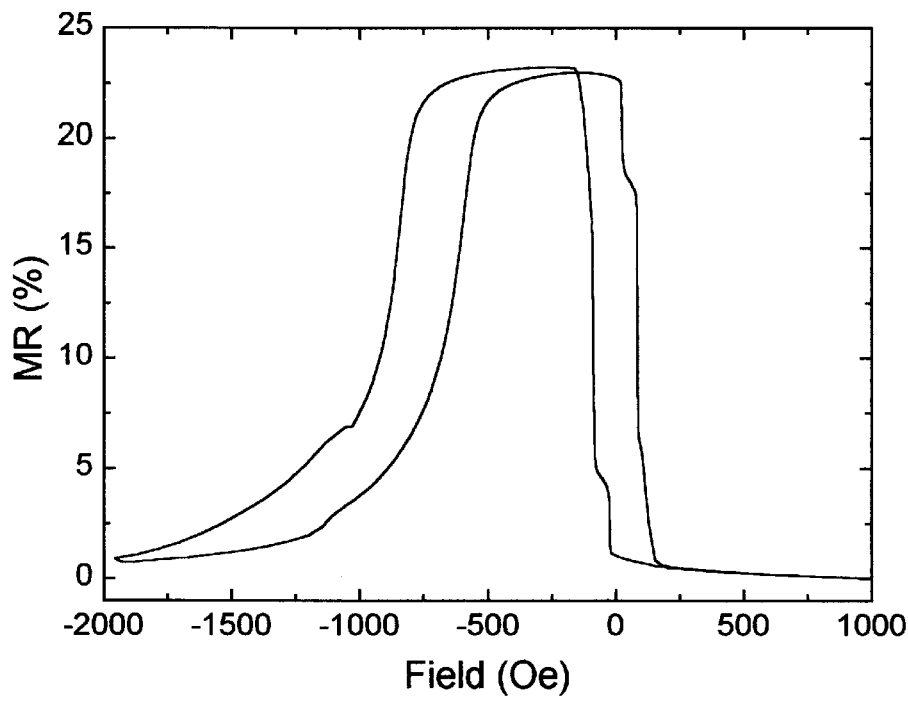

FIGS. 4A–4B show resistance versus applied magnetic field curves for a MTJ structure of the form:

Si/5000 Å $SiO_2$/50 Å Ti/150 Å Pd/180 Å OsIrMn/24 Å $Co_{84}Fe_{16}$/Ga (plasma oxidized for 240 seconds)/80 Å $Co_{84}Fe_{16}$/200 Å Pd.

The thickness of the Ga layer was 20 Å as determined from standard Rutherford back scattering (RBS) analysis. In this example the Ga oxide layer was formed by depositing a thin layer of Ga from a pure Ga sputtering target. The Ga film was then plasma oxidized for 240 seconds in 100 mTorr oxygen. This MTJ shows more than 22% MR at room temperature.

From a processing perspective, a problem with sputtering Ga is that Ga metal has a very low melting point just above room temperature. Moreover, once melted it remains supercooled in the liquid state, even for temperatures well below its thermodynamic melting point. Thus, while in the above examples the Ga (or Ga and Al) oxide films were sputtered and then plasma oxidized, the preferred method of preparing Ga oxide is by depositing Ga from an effusion source in the presence of oxygen gas or in the presence of more reactive oxygen provided by an atomic oxygen source or other source.

Because Ga has a very low melting point, it does not "wet" well and tends to ball up when deposited directly on the ferromagnetic layer. For that reason it may be desirable to first deposit a very thin layer of Al directly on the ferromagnetic layer, followed by the deposition of a layer of Ga on top of the thin Al layer. The completed bi-layer structure is then plasma oxidized. Alternatively, the thin Al layer can oxidized after it is deposited, followed by deposition of the Ga layer and its oxidation. In either case the resulting tunnel barrier layer would comprise a bi-layer of a very thin layer of $Al_2O_3$ (e.g., 3 to 10 Å) and a thicker layer of $Ga_2O_3$ (e.g., 5 to 20 Å). By appropriate selection of the thicknesses of the $Al_2O_3$ and $Ga_2O_3$ layers in the bi-layer tunnel barrier, it is also possible to tune the effective tunnel barrier height.

In the present invention it has been demonstrated that MTJs with much lower RA values than are possible with $Al_2O_3$ tunneling barriers are possible using $Ga_2O_3$ tunneling barriers. Since Ga is more polarizable than Al, $Ga_2O_3$ has a lower tunneling barrier height than $Al_2O_3$. Based on this work on Ga oxide and Al oxide tunneling barriers and, having demonstrated a lower tunneling barrier height for $Ga_2O_3$ compared to $Al_2O_3$, it is reasonable to anticipate that $In_2O_3$ would have a tunneling barrier height still lower than that of $Ga_2O_3$. Similarly, it is reasonable to anticipate that the nitrides of Ga and In will have significantly lower barrier heights than Al nitride. Thus the present invention is for MTJs with oxides or nitrides of Ga and/or In (with or without lesser amounts of Al oxide) as tunnel barrier layers. By alloying Ga or In with Al, for example, the barrier height of oxides or nitrides formed from the alloy can be tuned to be between the barrier heights of oxides or nitrides of pure Ga and pure Al.

The tunneling barrier layers in the MTJs according to the present invention can be formed from the oxides and nitrides of Ga and In and from alloys of Al—Ga, Ga—In, Al—In and Al—Ga—In by thermally evaporating the metal from one or more thermal effusion cells. The layers can then be exposed to oxygen or nitrogen to form the oxides and nitrides. Alternatively, the thermal effusion process can be carried out in the presence of oxygen or nitrogen, for example, in the presence of reactive oxygen or reactive nitrogen where the oxygen or nitrogen is formed from an atomic oxygen or nitrogen source. The barrier layers can also be formed by rf or ion beam sputtering from a target formed from the appropriate compound, for example, $Ga_2O_3$ or $In_2O_3$ or GaN or InN.

While the invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:
    a fixed ferromagnetic layer having a magnetic moment that is fixed in a preferred direction in the presence of an applied magnetic field in the range of interest;
    a free ferromagnetic layer whose magnetic moment is free to rotate in the presence of an applied magnetic field in the range of interest; and
    an insulating tunnel barrier layer located between and in contact with the fixed and free ferromagnetic layers, the tunnel barrier layer comprising an oxide or nitride of one or more of Ga and In.

2. The magnetic tunnel junction device according to claim 1 wherein the device is a magnetoresistive read head.

3. The magnetic tunnel junction device according to claim 1 wherein the device is a magnetic memory cell.

4. The magnetic tunnel junction device according to claim 1 further comprising a layer of antiferromagnetic material in contact with the fixed ferromagnetic layer for pinning the magnetic moment of the fixed ferromagnetic layer.

5. The magnetic tunnel junction device according to claim 1 wherein the magnetic moments of the fixed and free ferromagnetic layers are oriented generally perpendicular to one another in the absence of an applied magnetic field.

6. The magnetic tunnel junction device according to claim 1 wherein the magnetic moments of the fixed and free ferromagnetic layers are oriented generally parallel or anti-parallel to one another in the absence of an applied magnetic field.

7. The magnetic tunnel junction device according to claim 1 wherein the tunnel barrier layer includes an oxide or nitride of Al.

8. The magnetic tunnel junction device according to claim 1 wherein the tunnel barrier layer comprises a bi-layer, of an aluminum oxide layer directly on and in contact with one of said ferromagnetic layers and a gallium oxide layer directly on and in contact with the aluminum oxide layer.

9. A magnetic tunnel junction device comprising:
    a fixed ferromagnetic layer having a magnetic moment that is fixed in a preferred direction in the presence of an applied magnetic field in the range of interest;
    a free ferromagnetic layer whose magnetic moment is free to rotate in the presence of an applied magnetic field in the range of interest; and
    an insulating tunnel barrier layer located between and in contact with the fixed and free ferromagnetic layers, the tunnel barrier layer comprising an oxide of Ga.

10. The magnetic tunnel junction device according to claim 9 wherein the tunnel barrier layer comprises oxides of Ga and Al.

11. The magnetic tunnel junction device according to claim 9 wherein the tunnel barrier layer comprises a bi-layer of an aluminum oxide layer directly on and in contact with one of said ferromagnetic layers and a gallium oxide layer directly on and in contact with the aluminum oxide layer.

* * * * *